(12) United States Patent
Chen et al.

(10) Patent No.: US 6,281,140 B1
(45) Date of Patent: Aug. 28, 2001

(54) METHOD OF REDUCING THE ROUGHNESS OF A GATE INSULATOR LAYER AFTER EXPOSURE OF THE GATE INSULATOR LAYER TO A THRESHOLD VOLTAGE IMPLANTATION PROCEDURE

(75) Inventors: Chie-Chi Chen, Kaohsiung; Sheng-Liang Pan, Hsin-chu, both of (TW)

(73) Assignee: Taiwan Semiconductor Manufacturing Company, Hsin-chu (TW)

(*) Notice: Subject to any disclaimer, the term of this patent is extended or adjusted under 35 U.S.C. 154(b) by 0 days.

(21) Appl. No.: 09/591,846

(22) Filed: Jun. 12, 2000

(51) Int. Cl.⁷ .................... H01L 21/4763; H01L 21/31
(52) U.S. Cl. ................. 438/763; 438/594; 438/787; 438/289
(58) Field of Search .................... 438/763, 778, 438/770, 787, 594, 585, 287, 289

(56) References Cited

U.S. PATENT DOCUMENTS

| | | | |
|---|---|---|---|
| 3,925,107 | 12/1975 | Gdula et al. | 148/1.5 |
| 5,393,686 | 2/1995 | Yeh et al. | 437/45 |
| 5,504,022 | * 4/1996 | Nkanishi et al. | 438/594 |
| 5,922,136 | 7/1999 | Huang | 134/2 |
| 5,926,741 | * 7/1999 | Matsuoka et al. | 438/778 |

FOREIGN PATENT DOCUMENTS

02000243699 * 9/2000 (JP).

* cited by examiner

Primary Examiner—Charles Bowers
Assistant Examiner—Thanh Nguyen
(74) Attorney, Agent, or Firm—George O. Saile; Stephen B. Ackerman

(57) ABSTRACT

A process for reducing the surface roughness of a silicon dioxide gate insulator layer, that has been subjected to a boron ion implantation procedure, has been developed. The process features the use of an ammonium hydroxide-hydrogen peroxide solution, applied to the gate insulator layer, to reduce the surface roughness of the gate insulator layer, created by the boron ion implantation procedure. The treatment of the gate insulator layer, in the ammonium hydroxide-hydrogen peroxide solution, results in a surface roughness equivalent to the surface roughness of the gate insulator layer, prior to the boron ion implantation procedure.

15 Claims, 2 Drawing Sheets

METHOD OF REDUCING THE ROUGHNESS OF A GATE INSULATOR LAYER AFTER EXPOSURE OF THE GATE INSULATOR LAYER TO A THRESHOLD VOLTAGE IMPLANTATION PROCEDURE

BACKGROUND OF THE INVENTION (1) Field of the Invention

The present invention relates to methods used to fabricate semiconductor devices, and more specifically to a method used to reduce the roughness of a gate insulator layer, which had previously been subjected to a threshold voltage ion implantation procedure.

(2) Description of Prior Art

The desired threshold voltage, for both N channel, (NMOS), as well as P channel, (PMOS), metal oxide semiconductor devices, are usually accomplished via ion implantation procedures, performed through a gate insulator layer into the channel region of the complimentary metal oxide semiconductor, (CMOS), device. These implantation procedures, usually performed through a silicon oxide gate insulator layer, using boron or $BF_2$ ions, for both the NMOS and PMOS devices, can however result in an increase in the roughness of the surface of a silicon oxide gate insulator layer. The increase in surface roughness of the gate insulator layer negatively influences the coatablity of overlying photoresist layers, used to define subsequent device features.

This invention will teach a novel procedure used to restore the topography, or surface roughness of a silicon oxide gate insulator layer, which had been subjected to a boron type, threshold adjust, ion implantation procedure. Prior art, such as Gdula et al, in U.S. Pat. No. 3,925,107, describe a post-oxidation, anneal process which reduces the fixed charge, and fast states, in silicon dioxide, gate layers as thin as 100 Angstroms. However that prior art does address the novel process, now presented, allowing reductions in the surface roughness of the thin silicon oxide gate insulator layers, after the surface roughness of the gate insulator layer was increased as a result of being subjected to a threshold adjust implantation procedure.

SUMMARY OF THE INVENTION

It is an object of this invention to fabricate NMOS and CMOS devices, featuring a threshold adjust procedure, accomplished via implantation of boron ions through a thin silicon oxide gate insulator layer.

It is another object of this invention to subject the silicon oxide gate insulator layer to an ammonium peroxide mixture, (APM), after the threshold adjust ion implantation procedure, to reduce the surface roughness of the silicon oxide gate insulator layer, resulting from the threshold adjust ion implantation procedure.

In accordance with the present invention a method of forming CMOS devices, featuring a process used to reduce the surface roughness of a silicon oxide gate insulator, subjected to an ion implantation procedure, is described. After thermally growing a silicon oxide layer, to be used for a gate insulator layer for both NMOS and PMOS devices, boron ions are implanted through the silicon oxide gate insulator region, into the semiconductor substrate, forming threshold adjust regions for both subsequent NMOS and PMOS devices. A solution of an ammonium peroxide mixture is then used to reduce the roughness of the silicon oxide gate insulator, which was generated as a result of the boron ion, threshold adjust implantation procedure. Formation of subsequent features, such as gate structures, lightly doped source/drain regions, and heavily doped source/drain regions, are accomplished via conventional photolithographic procedures in which the needed thickness of photoresist coatings is minimized as a result of the underlying smooth silicon oxide surface.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
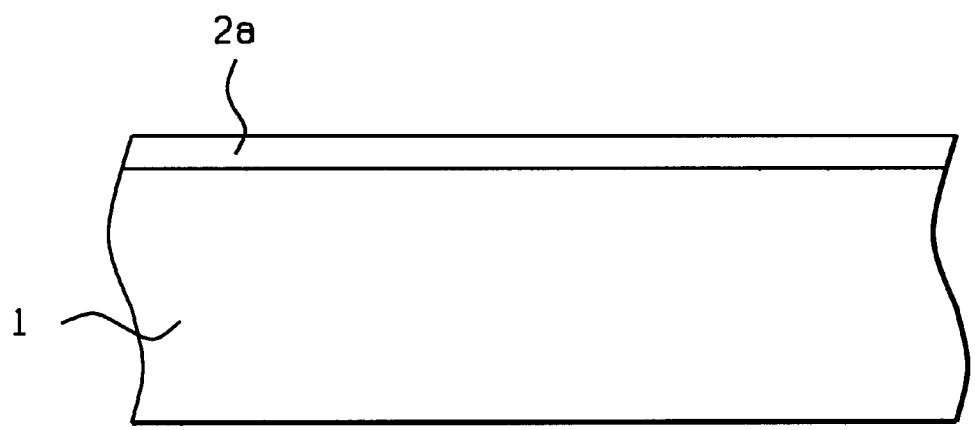
FIGS. 1–4, which schematically in cross-sectional style, describe key stages of fabrication used to create CMOS devices featuring the use of an ammonium peroxide solution, applied to a silicon oxide gate insulator layer, to reduce the surface roughness of the silicon oxide gate insulator layer, generated by the implantation of boron ions through the gate insulator layer.

The method of fabricating CMOS devices, featuring the use of an ammonium peroxide mixture, (APM), applied to a silicon oxide gate insulator layer, to reduce the surface roughness of the silicon oxide gate insulator layer, where the increased surface roughness was generated by a previously performed threshold adjust implantation procedure, wherein boron ions are implanted through the gate insulator layer, will now be described in detail. A P type semiconductor substrate 1, comprised of single crystalline silicon, with a <100> crystallographic orientation is used and schematically shown in FIG. 1. Gate insulator layer 2a, comprised of silicon dioxide, at a thickness between about 50 to 200 Angstroms, is next thermally grown in an oxygen-steam ambient at a temperature between about 900 to 1100° C. The surface roughness of gate insulator layer 2a, is critical for the application of subsequent photoresist layers. Increased surface roughness results in the need for thicker applied photoresist layers, to insure adequate coverage. The increased photoresist thickness, in addition to increasing cost, also reduces the ability to define narrow features in the thicker photoresist layer, negatively influencing the attainment of sub-0.25 micron features, such as narrow width gate structures. The surface roughness, or the difference between the highest and lowest features, for as-grown, silicon dioxide gate insulator 2a, shown schematically in FIG. 2, as measured by atomic force microscopy, (AFM), is between about 6 to 7 Angstroms, which is considered smooth, allowing a thin photoresist layer to be adequately applied.

Figure 2:
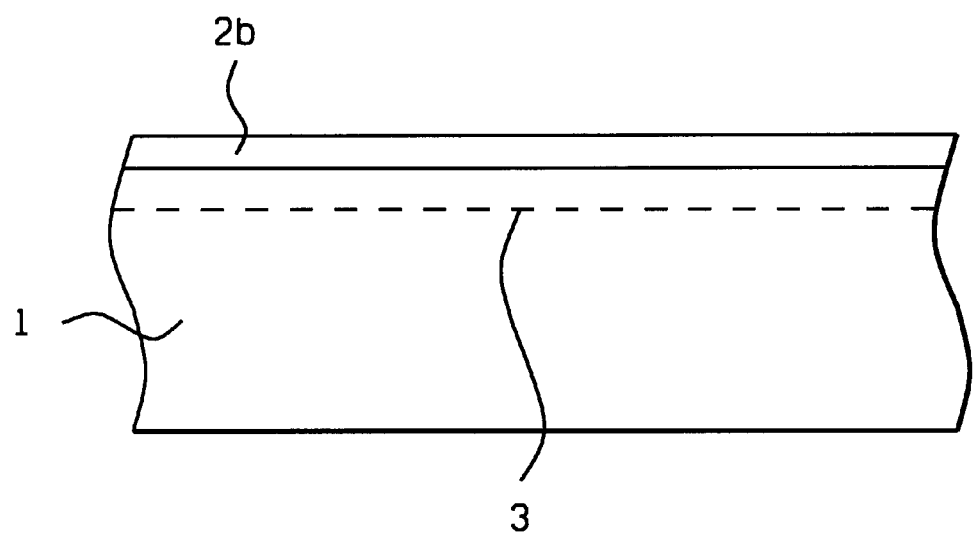

To achieve the desired threshold voltages for both NMOS and PMOS devices, the doping of the channel region of these devices, have to be adjusted. This is usually accomplished via ion implantation of dopants through the gate insulator layer. This ion implantation procedure, referred to as the threshold adjust, ion implantation procedure is accomplished for both NMOS and PMOS devices using boron ions. Threshold adjust region 3, shown schematically in FIG. 2, is formed via implantation of boron ions, at an energy between about 25 to 40 KeV, at a dose between about 1E11 to 1E12 atoms/$cm^2$. These implantation conditions result in the desired threshold voltages for the NMOS and PMOS devices, of a CMOS or BiCMOS, (bipolar-CMOS), design. Unfortunately the threshold adjust, ion implantation procedure, performed through the gate insulator layer, results in an increase in the surface roughness of the gate insulator layer. For the above threshold adjust, ion implantation condition, silicon dioxide gate insulator 2b, is created, with a surface roughness, as measured by AFM, between about 14 to 16 Angstroms. This level of surface roughens would require about 3.5 cc of photoresist to adequately coat the wafer comprised with silicon oxide gate insulator 2b, while only about 2.0 cc of photoresist would have been needed to coat the same wafer, prior to the threshold adjust, ion implantation procedure.

Figure 3:
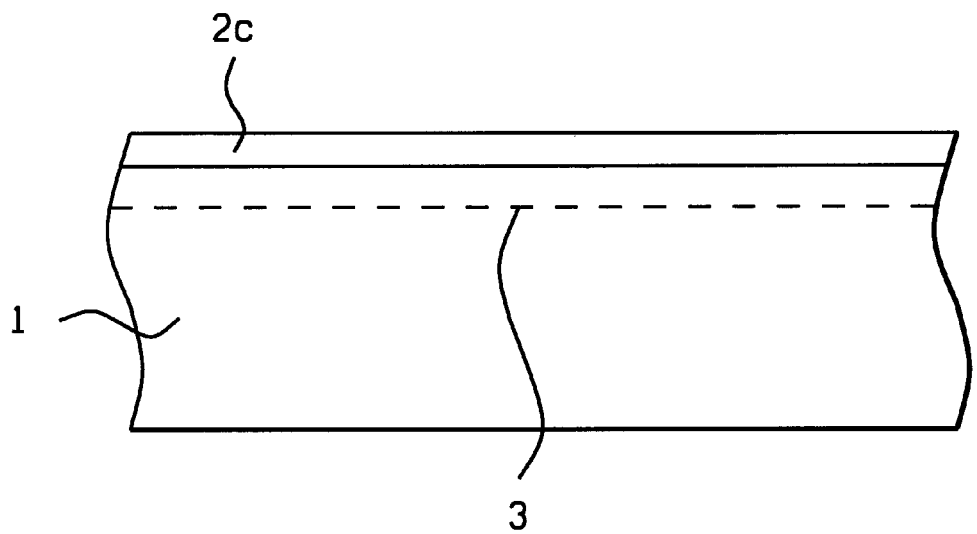

A method to restore, or reduce the surface roughness of the gate insulator layer subjected to the threshold adjust, ion implantation procedure, is next described, and shown schematically in FIG. 3. The semiconductor substrate, post-threshold adjust, ion implantation procedure, is subjected to a treatment in a solution comprised of $NH_4OH$—$H_2O_2$. The Ammonium Peroxide Mixture, (APM), is applied at a power between 200 to 300 watts, at a temperature between about 40 to 50° C., for a time between about 5 to 15 min. The concentration of the APM solution is 1 part $NH_4OH$, 4 parts $H_2O_2$, and 20 parts $H_2O$. This treatment does not etch the exposed gate insulator layer, but does results in atom crystal arrangement of the gate insulator layer, resulting in silicon dioxide gate insulator 2c, shown schematically in FIG. 3, with a surface roughens, as measured by AFM, between about 2.5 to 3.0 Angstroms. The attainment of this smooth top surface for silicon dioxide gate insulator 2c, allows less photoresist per wafer to be used, as well as allowing the use of thinner, subsequent photoresist layers. The use of thinner photoresist layers allow narrower features to be defined in the thinned photoresist layers, when compared to features defines in thicker photoresist layers.

Figure 4:
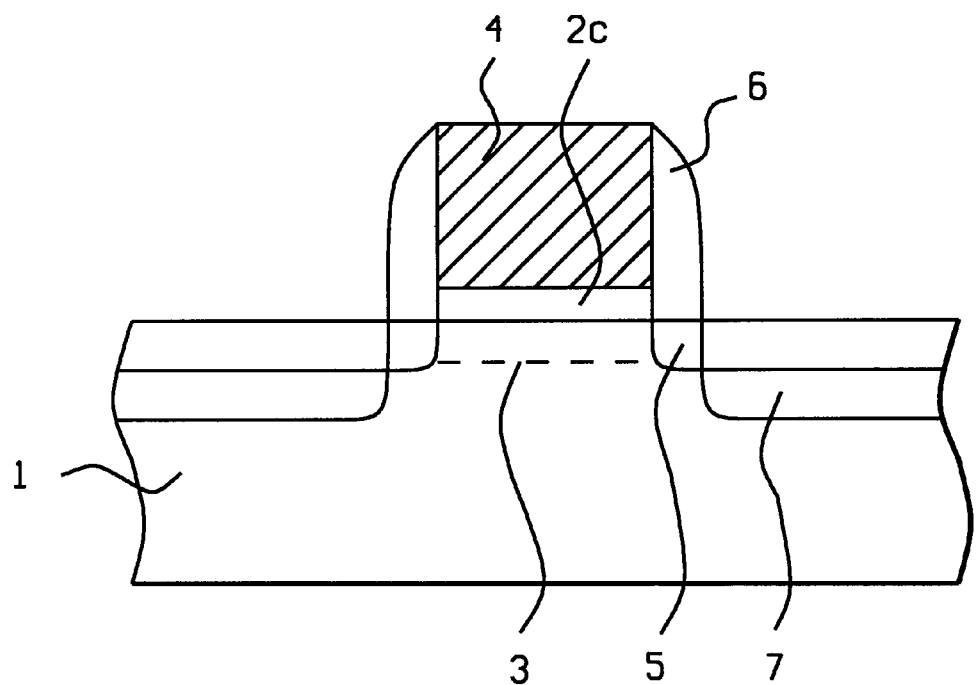

The conclusion of the NMOS or PMOS device is schematically shown in FIG. 4. Gate structure 4, comprised of polysilicon, is next formed, via deposition of a polysilicon layer, via low pressure chemical vapor deposition, (LPCVD), procedures, at a thickness between about 1500 to 2500 Angstroms. The polysilicon layer can be doped in situ, during deposition via the addition of arsine, or phosphine to a silane ambient, or the polysilicon layer can be deposited intrinsically then doped via implantation of arsenic or phosphorous ions. Conventional photolithographic and reactive ion etching, (RIE), procedures, using $Cl_2$ or $SF_6$ are used as an etchant for polysilicon. After removal of the photoresist shape used to define gate structure 4, via plasma oxygen ashing and careful wet cleans, N type, lightly doped source/drain region 5, is formed in a region of semiconductor substrate 1, not covered by gate structure 4, for NMOS devices. A photoresist block out shape is used to protect subsequent PMOS regions from an N type, ion implantation procedure used to create N type,.lightly doped source/drain region 5. After removal of the photoresist block out shape, used to protect PMOS devices from the N type, ion implantation procedure used to form N type, lightly doped source/drain region 5, another photoresist block out shape is used to protect NMOS device regions from a P type, ion implantation procedure used to create P type, lightly doped source/drain regions. As a result of the smooth top surface of silicon dioxide gate insulator layer 2c, less photoresist is needed for the desired photoresist block out shape.

After formation of the NMOS and PMOS lightly doped source/drain regions, insulator spacers 6, are formed on the sides of gate structure 4, via deposition of an insulator layer such as silicon oxide, or silicon nitride, via LPCVD or via plasma enhanced chemical vapor deposition, (PECVD), procedures, at a thickness between about 1000 to 2500 Angstroms, followed by an anisotropic RIE procedure, using $CHF_3$ or $CF_4$ as an etchant. Heavily doped source drain regions 7, are then formed via ion implantation into regions of semiconductor substrate 1, not covered by gate structure 4, or by insulator spacers 6. As was the case for the lightly doped source/drain regions, an N type heavily doped source/drain region is formed for NMOS devices, while a P type heavily doped source/drain region is formed for he PMOS devices. Again photoresist block out shapes are used for protection of a specific device type, during formation of either the P type, or N type, heavily doped source/drain region. Again the smooth, underlying silicon dioxide layer 2c, allowed thinner photoresist to be applied, reducing cost as well as increasing the ability to define narrow features, when compared to counterparts formed with thicker photoresist applications.

While this invention has been particularly shown and described with reference to the preferred embodiments thereof, it will be understood by those skilled in the art that various changes in form and details may be made without departing from the spirit or scope of the invention.

What is claimed is:

1. A method of reducing the surface roughness of a gate insulator layer, on a semiconductor substrate, comprising the steps of:

growing a first gate insulator layer, comprised with a first surface roughness, on said semiconductor substrate;

performing an ion implantation procedure, thorough said first gate insulator layer, forming a threshold adjust region in said semiconductor substrate, and converting said first gate insulator layer to a second gate insulator layer, with said second gate insulator layer comprised with a second surface roughness; and performing a treatment in a solution comprised with an ammonium peroxide mixture, to convert said second gate insulator layer to a third gate insulator layer, with said third gate insulator layer comprised with a third surface roughness.

2. The method of claim 1, wherein said first gate insulator is a silicon dioxide layer, at a thickness between about 50 to 200 Angstroms, obtained via thermal oxidation procedures, in an oxygen-steam ambient, at a temperature between about 900 to 1100° C.

3. The method of claim 1, wherein said first surface roughness, of said first gate insulator layer, as measured by atomic force microscopy, (AFM), is between about 6 to 7 Angstroms.

4. The method of claim 1, wherein said ion implantation procedure, performed through said first gate insulator layer and used to form said threshold adjust region, is performed using boron ions, at an energy between about 25 to 40 KeV, at a dose between about 1E11 to 1E12 atoms/$cm^2$.

5. The method of claim 1, wherein said second gate insulator layer is a silicon dioxide layer, comprised with said second surface roughness, as measured by AFM, between about 14 to 16 Angstroms.

6. The method of claim 1, wherein said solution used to convert said second gate insulator layer to said third gate insulator layer, is comprised of 1 part $NH_4OH$, 4 parts $H_2O_2$, and 20 parts $H_2O$, and is applied to said second gate insulator layer at a power between about 200 to 300 watts, at a temperature between about 40 to 50° C., for a time between about 5 to 15 min.

7. The method of claim 1, wherein said third gate insulator layer is a silicon dioxide layer, comprised with said third surface roughness, as measured by AFM, between about 2.5 to 3.0 Angstroms.

8. A method of reducing the surface roughness of a silicon dioxide gate insulator layer, on a semiconductor substrate, via treatment in a solution containing an ammonium peroxide mixture, comprising the steps of:

growing a first silicon dioxide gate insulator layer, comprised with a first surface roughness, on said semiconductor substrate;

performing a boron ion implantation procedure through said first silicon dioxide gate insulator layer, to form a threshold adjust region in said semiconductor substrate, and converting said first silicon dioxide gate insulator layer to a second silicon dioxide gate insulator layer, with said second silicon dioxide gate insulator layer comprised with a second surface roughness;

performing said treatment, in said ammonium peroxide mixture, comprised of ammonium hydroxide and hydrogen peroxide, to convert said second silicon dioxide gate insulator layer to a third silicon dioxide gate insulator layer, with said third silicon dioxide gate insulator layer comprised with a third surface roughness.

9. The method of claim 8, wherein said first silicon dioxide gate insulator is obtained via thermal oxidation procedures, in an oxygen-steam ambient, at a temperature between about 900 to 1100° C., at a thickness between about 50 to 200 Angstroms.

10. The method of claim 8, wherein said first surface roughness, of said first silicon dioxide gate insulator layer, as measured by atomic force microscopy, (AFM), is between about 6 to 7 Angstroms.

11. The method of claim 8, wherein said boron ion implantation procedure, performed through said first silicon dioxide gate insulator layer, used to form said threshold adjust region, is performed at an energy between about 25 to 40 KeV, at a dose between about 1E11 to 1E12 atoms/cm$^2$.

12. The method of claim 8, wherein said second silicon dioxide gate insulator layer is comprised with said second surface roughness, as measured by AFM, between about 14 to 16 Angstroms.

13. The method of claim 8, wherein said solution of ammonium hydroxide and hydrogen peroxide, used to convert said second silicon dioxide gate insulator layer to said third silicon dioxide gate insulator layer, is comprised of 1 part $NH_4OH$, 4 parts $H_2O_2$, and 20 parts $H_2O$.

14. The method of claim 8, wherein said treatment, of said second silicon dioxide gate insulator layer in said solution of ammonium hydroxide and hydrogen peroxide, is performed at a power between about 200 to 300 watts, at a temperature between about 40 to 50° C., for a time between about 5 to 15 min.

15. The method of claim 8, wherein said third silicon dioxide gate insulator layer is comprised with said third surface roughness, as measured by AFM, of between about 2.5 to 3.0 Angstroms.

* * * * *